United States Patent [19]

Ikeda et al.

[11] Patent Number: 5,521,053

[45] Date of Patent: * May 28, 1996

[54] PHOTOCURABLE RESIN COMPOSITION FOR THE PREPARATION OF A PRINTED WIRING BOARD

[75] Inventors: Nobuo Ikeda, Kawasaki; Hisao Narahara, Tokyo; Minoru Iizuka, Komukainishimachi; Toshiaki Inomata, Yokohama; Tatsuo Yamaguchi, Hino; Hiroyoshi Oomika, Yokohama; Fumio Shiratori, Kawasaki, all of Japan

[73] Assignee: Nippon Petrochemicals Co., Ltd., Tokyo, Japan

[ * ] Notice: The portion of the term of this patent subsequent to Jul. 28, 2009, has been disclaimed.

[21] Appl. No.: 768,073

[22] Filed: Sep. 26, 1991

Related U.S. Application Data

[63] Continuation-in-part of Ser. No. 387,215, Jul. 28, 1989, Pat. No. 5,057,400.

[30] Foreign Application Priority Data

Jan. 30, 1990 [JP] Japan ................................. 2-17971
Jan. 30, 1990 [JP] Japan ................................. 2-17972

[51] Int. Cl.$^6$ ............................. G03C 1/725; C08K 3/28
[52] U.S. Cl. ................................. 430/285.1; 430/287.1; 522/71
[58] Field of Search ....................... 430/285, 287; 522/71

[56] References Cited

U.S. PATENT DOCUMENTS

| | | | |
|---|---|---|---|
| 3,661,588 | 5/1972 | Chang | 430/281 X |
| 3,974,129 | 8/1976 | De La Mare | 204/159.24 |
| 4,038,084 | 7/1977 | Nakano et al. | 430/910 X |
| 4,482,656 | 11/1984 | Nguyen et al. | 428/447 X |
| 4,601,970 | 7/1986 | Cohen et al. | 430/281 X |
| 4,789,620 | 12/1988 | Sasaki et al. | 430/288 X |
| 4,857,434 | 8/1989 | Klinger | 430/286 |
| 5,057,400 | 10/1991 | Yamaguchi et al. | 430/314 |
| 5,407,784 | 4/1995 | Berrier et al. | 430/287 |

FOREIGN PATENT DOCUMENTS 0353924  2/1990  European Pat. Off. .
2048941 12/1980  United Kingdom .

*Primary Examiner*—George F. Lesmes
*Assistant Examiner*—Bernard P. Codd
*Attorney, Agent, or Firm*—Bucknam and Archer

[57] ABSTRACT

A photocurable resin composition comprising (a) 100 parts by weight of a modified resin prepared by reacting an α,β-unsaturated dicarboxylic acid anhydride adduct having a softening point ranging from 70° to 200° C. and derived from a conjugated diene polymer or copolymer having a number average molecular weight of 500 to 5000 and a vinyl group content of 50 mole % or above, with an α,β-unsaturated monocarboxylic acid ester having a specific alcoholic hydroxy group to open at least 10 mole % of the acid anhydride rings present in the adduct, (b) inorganic or organic powder having an average particle diameter of not larger than 5 μm or inorganic powder grafted with a hydrocarbon residue, and (c) a photopolymerization initiator.

12 Claims, No Drawings ated on Oct. 15,
PHOTOCURABLE RESIN COMPOSITION FOR THE PREPARATION OF A PRINTED WIRING BOARD This application is a Continuation-In-Part of U.S. Ser. No. 387,215 filed Jul. 28, 1989, which issued on Oct. 15, 1991 as U.S. Pat. No. 5,057,400.

[TECHNICAL FIELD]

The present invention relates to a photocurable resin composition prepared by mixing a specific modified resin prepared by the modification of a conjugated diene polymer or copolymer with a specific inorganic or organic powder, or a grafted inorganic powder such as grafted silica. Particularly, the present invention relates to a photocurable resin composition suitable for the preparation of a printed wiring board by photocuring.

[BACKGROUND ART]

Various processes for the preparation of a printed wiring board have already been developed, among which a process comprising the use of a photocurable and photosensitive resin composition as an etching resist and a process comprising the use of said resin composition as a plating resist have recently been employed predominantly.

The former process comprises forming a layer of a photocurable resin composition on a circuit board substrate by some means, adhering a negative-type circuit pattern mask closely to the layer, irradiating actinic rays on the whole to cure desired portions of the layer, removing uncured portions of the layer by development and then etching the resulting board to form a predetermined circuit pattern.

The latter process comprises irradiating a photocurable resin layer formed on a circuit board substrate with actinic rays through a positive-type pattern mask, removing desired portions of the resin layer by development, plating the desired portions with, e.g., etching-resistant solder, stripping off undesired portions of the resin layer and then etching the resulting board to obtain a predetermined circuit pattern.

The "circuit pattern mask" used in the above processes corresponds to a photographic negative and comprises a light-barrier layer for forming a suitable pattern on a transparent substrate. Although glass may be used as the substrate or base, a plastic film such as polyester film is predominantly used at present. The material of the light-barrier layer is generally chromium, silver or other metal.

The photocurable-resin composition used in the above processes generally comprises (1) a binder polymer, (2) a photopolymerizable monomer or oligomer (as a crosslinking agent), (3) a photopolymerization initiator and (4) other components such as a stabilizer, colorant and flame retardant.

The binder polymer serves to shape the resin composition into a film and may mainly be an acrylic polymer which is prepared by the copolymerization of acrylic acid, an acrylate ester, methacrylic acid, a methacrylate ester, styrene etc. and has a molecular weight of several tens of thousands.

The photopolymerizable monomer or oligomer also contains an acryloyl or methacrylol group. The principle of the above circuit pattern forming process resides in that such a resin composition is used to form a layer and only desired areas of the layer are insolubilized by light exposure.

Although U.S. Pat. No. 3,954,587 discloses a process comprising the use of a specific photocurable composition containing a maleinized oil as a so-called photoresist such as an etching resist, it has been ascertained by the follow-up made by the inventors of the present invention that the resulting coating before irradiation with light is tacky at ordinary temperatures as examined according to the tack test, because the composition used in said Patent comprises a maleinized oil and an ethylenically unsaturated compound monomer having at least two unsaturated bonds in the molecule.

In the conventional production of a printed wiring board, a circuit pattern mask is adhered in a vacuum closely to a photosensitive coating formed on a substrate, and the whole is then exposed to UV. If the photosenstive resin coating is tacky at ordinary temperatures, the coating will partially remain adhered to it is attempted to peel the mask from the coating after the exposure. Although this adhesion can be prevented by using a cooling apparatus or bath after the exposure step, this means will increase the equipment cost, necessitate one additional step and make the operation troublesome unfavorably. Meanwhile, the application of a release agent or the like to the circuit pattern mask will exert adverse effects on the formation of a fine pattern. Under these circumstances, the inventors of the present invention have reported in Japanese Patent Application Laid-Open Gazette No. 138371/1990 that a photosensitive resin coating made from a modified resin prepared by adding an $\alpha,\beta$-unsaturated dicarboxylic acid anhydride to a conjugated diene polymer or copolymer to form an adduct having a softening point of 70° to 200° C. (as determined by the ring and ball softening point method according to JIS K 2531-60) and reacting the adduct with an $\alpha,\beta$-unsaturated mono- or di-carboxylic acid ester having an alcoholic hydroxy group to open a part or the whole of the acid anhydride rings and introduce conjugated double bonds into the adduct, is little tacky at ordinary temperatures as examined according to the tack test.

In the practical production of a printed wiring board, the extent of adhesion of a photosensitive coating remaining adhered to a circuit pattern mask after the step of peeling the mask from the coating varies depending upon various conditions such as temperature, pressure and time. In any case, a higher temperature, a higher pressure or a longer time will cause the coating to remain adhered to the mask more easily after the removal of the mask. For example, because the practical production of a printed wiring board is conducted continuously, the temperature of the atmosphere itself is liable to rise by the heat radiation from a light source. Further, the vacuum adhesion of the mask to the photosensitive coating applies a pressure to a substrate for the board. These phenomena are causative of more liability of the coating to remain adhered to the mask.

Therefore, the inventors of the present invention tested the photosensitive coating of Japanese Patent Application Laid-Open Gazette No. 138371/1990 for its adhesion to a pattern mask after the step of peeling the mask under approximately the same conditions as those for the practical production with the result that the coating of said application was found to be not always satisfactory.

In the above test, a distinct peel noise was heard when the pattern mask was peeled off the coating after light exposure, which means that the coating was not completely tack-free. When the photosensitive resin coating is not completely tack-free, during the repeated use of the pattern mask, which is expensive, in the industrial production of circuit boards, the resin will cumulatively adhere to the peeled mask, which makes further use of the mask impossible or gives a deficient or short-circuited resist pattern at the worst.

Further, the photosensitive coating formed on a substrate for a wiring board must have a measure of hardness. This is because the steps of producing a printed wiring board are carried out one after another on a conveyor line, that is, a substrate having a photosensitive resin coating formed thereon is transferred to a light exposure step through the conveyor line, during which the coating is liable to be damaged when it is soft. The photosensitive resin coating made from the previously mentioned modified resin is insufficient in this respect.

[DISCLOSURE OF INVENTION]

An object of the present invention is to provide a composition which can give a substantially tack-free photosensitive coating having a sufficiently high hardness.

This object is achieved by providing a photocurable resin composition comprising (a) 100 parts by weight of a modified resin prepared by reacting an α,β-unsaturated dicarboxylic acid anhydride adduct having a softening point ranging from 70° to 200° C. (as determined by the ring and ball softening point method according to JIS K 2531-60) and derived from a conjugated diene polymer or copolymer having a number average molecular weight of 500 to 5000 and vinyl group content of 50 mole % or above, with an α,β-unsaturated monocarboxylic acid ester having an alcoholic hydroxy group represented by the following general formula (I),

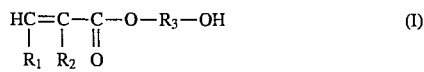

wherein $R_1$ and $R_2$ each represent a hydrogen atom or a methyl group; and $R_3$ represents a hydrocarbon residue having at least 2 carbon atoms which may contain a heteroatom therein, to open at least 10 mole % of the acid anhydride rings present in the adduct, (b) 3 to 50 parts by weight of inorganic or organic powder having an average particle diameter of not larger than 5 μm, and (c) 0.1 to 20 parts by weight of a photopolymerization initiator.

In a second aspect, the present invention relates to a photocurable resin composition comprising, as a component (b), 3 to 50 parts by weight of grafted inorganic powder (the total number of carbon atoms in the grafted hydrocarbon residue per inorganic atom is at least 4) prepared by grafting inorganic powder having an average particle diameter, not larger than 0.1 μm with a saturated or unsaturated, substituted or unsubstituted hydrocarbon residue, the component (b) in the second aspect being one substituted for 3 to 50 parts by weight of the inorganic or organic powder of the component (b) in the first aspect.

[BEST MODE FOR CARRYING OUT THE INVENTION]

The present invention will now be described in more detail.

In the present invention, there is used a modified resin (a) prepared by adding a conjugated diene polymer or copolymer with an α,β-unsaturated dicarboxylic acid anhydride to form an adduct having a softening point of 70° to 200° C. (as determined by the ring and ball softening point method according to JIS K 2531-60) and reacting the thus obtained adduct with an α,β-unsaturated monocarboxylic acid ester having an alcoholic hydroxyl group to open a part or the whole of the acid anhydride rings present in the adduct.

The conjugated diene polymer or copolymer to be used in the resin composition of the present invention is a lower polymer of a conjugated diolefin having 4 or 5 carbon atoms, such as butadiene or isoprene, or a copolymer of low degree of polymerization comprising one or more of these conjugated diolefins and an ethylenically unsaturated monomer other than the conjugated diolefins, said monomer being particularly selected from among aliphatic and aromatic monomers such as isobutylene, diisobutylene, styrene, α-methylstyrene, vinyltoluene and divinyltoluene. Alternatively, a mixture of two or more of the polymers and the copolymers may be used.

The above conjugated diene polymer or copolymer is one having a vinyl content of 50 mole % or above and a number average molecular weight ranging from 500 to 5000. A conjugated diene polymer or copolymer having a vinyl content of less than 50 mole % will give a too low crosslinking density unfavorably. Further, a conjugated diene polymer or copolymer having a number average molecular weight of less than 500 will give a photosensitive coating poor in strength, while one having a number average molecular weight exceeding 5000 will not give any smooth coating unfavorably.

The preparation of the above modified resin can be conducted as follow.

The conjugated diene polymer or copolymer can be prepared by conventional processes. Typical one of these processes comprises anionically polymerizing one or more conjugated diolefins having 4 or 5 carbon atoms preferably together with an aromatic vinyl monomer such as styrene, α-methylstyrene, vinyltoluene or divinyltoluene in an amount of at most 50 mole % based on the conjugated diolefins in the presence of an alkali metal or organoalkali metal compound as a catalyst at a temperature of 0° to 100° C. In this case, to obtain a light-colored polymer or copolymer having a controlled molecular weight and a lowered gel fraction is desired, it is suitable to employ a chain transfer polymerization process using an organoalkali metal compound such as benzyl sodium and a compound having an alkylaryl group such as toluene as a chain transfer agent (see U.S. Pat. No. 3,789,090), a living polymerization process which comprises conducting the polymerization in tetrahydrofuran as a solvent in the presence of a polycyclic aromatic compound such as naphthalene as an activator and an alkali metal catalyst such as sodium, or a process characterized by modifying the molecular weight by the use of an aromatic hydrocarbon such as toluene or xylene as a solvent, a dispersion of a metal such as sodium as a catalyst and the addition of an ether such as dioxane. Further, there may be used a lower polymer prepared by the coordination anionic polymerization using an acetylacetonate of a Group VIII metal of the periodic table, such as cobalt or nickel, or an alkylaluminum halide as a catalyst.

Then, the conjugated diene polymer or copolymer is addition reacted with an α,β-unsaturated dicarboxylic acid anhydride to form an adduct.

The α,β-unsaturated dicarboxylic acid anhydride to be used in the present invention includes maleic anhydride, citraconic anhydride and chloromaleic anhydride.

Generally, the above addition reaction is conducted at a temperature of 100° to 250° C. in an inert solvent in which either the (co)polymer or the anhydride or both of them are soluble. In this addition reaction, 0.1 to 0.3 part by weight of hydroquinone, catechol or a p-phenylenediamine derivative is used as an antigelling agent.

According to the present invention, the addition of an α,β-unsaturated dicarboxylic acid anhydride must be conducted so as to give an adduct having a softening point ranging from 70° to 200° C. (as determined by the ring and ball softening point method according to JIS K 2531-60). If the softening point is lower than 70° C., the resulting coating will be tacky, while if it exceeds 200° C., no smooth coating will be formed unfavorably. The softening point varies mainly depending upon the unsaturated bond content and molecular weight of the conjugated diene polymer or copolymer used as the raw material and the amount of the α,β-unsaturated dicarboxylic acid anhydride added to the (co)polymer. For example, when a liquid polybutadiene having a number average molecular weight of 1,000 is used, the adduct obtained must have a total acid number of 400 mgKOH/g or above.

In the next step, the adduct of the acid anhydride obtained by the method as mentioned above is reacted with an α,β-unsaturated monocarboxylic acid ester having an alcoholic hydroxy group represented by said formula (I) to prepare a modified resin described as said component (a) in which at least a part of the ring of the acid anhydride groups present in the adduct has been opened.

The number of carbon atoms of $R_3$ group in said formula (I) is preferably 2 to 20 and a preferable heteroatom which may contain in $R_3$ group (a) is nitrogen or oxygen atom.

Examples of the α,β-unsaturated monocarboxylic acid ester having an alcoholic hydroxyl group represented by the above general formula (I) include 2-hydroxyethyl acrylate, 2-hydroxylethyl methacrylate, 2-hydroxypropyl acrylate, 2-hydroxypropyl methacrylate, N-methylolacrylamide, 2-hydroxy-3-phenoxypropyl acrylate and 2-hydroxy-3-phenoxypropyl methacrylate, which may be used singly or jointly.

The ring opening reaction of the acid anhydride groups is generally conducted in the presence of a base catalyst at a relatively low temperature of 100° C. or below. It is preferable to use a solvent which is inert to the unsaturated monocarboxylic acid ester and the acid anhydride groups and can dissolve both of them therein in the ring opening reaction. Examples of such a solvent include aromatic hydrocarbons such as toluene and xylene; ketones such as methyl ethyl ketone and methyl isobutyl ketone; esters such as ethyl acetate; ethers free from hydroxyl group such as diethylene glycol dimethyl ether and triethylene glycol dimethyl ether; and tertiary alcohols such as diacetone alcohol.

In any case, it is suitable in view of photocurablility that the extent of ring-opening by reaction with an α,β-unsaturated monocarboxylic acid ester having an alcoholic hydroxyl group extends to not less than 10 mol %, preferably not less than 30 mol % of the acid anhydride groups. If the extent is less than 10 mol % the resulting modified resin composition will unfavorably be insufficient in photocurability.

In the manner so far mentioned, the modified resin of the above-mentioned (a) can be prepared.

With regard to the material (b), either of inorganic and organic powders may be used, so long as it has an average particle diameter of 5 μm or less, preferably 1 μm or less, more preferably 0.1 μm or less, but the material (b) is not substantially compatible with the modified resin (a). However, if importance is placed on the fact that the photosensitivity of a photosensitive coating film which can usually be formed should not be decreased, it is preferable to use a material which does not scatter light and which absorbs a lower amount of rays in the UV region of from 300 to 400 nm. Examples of such a material (b) include silica, alumina, barite, chalk, zinc yellow, red iron oxide and ultramarine. Furthermore, if importance is placed on cost and stability, examples of the material (b) include, aluminum silicate type compounds such as kaolinite, halloysite and common mica, talc, calcium carbonate, magnesium carbonate, Phthalocyanine Blue and a plastic powder such as a fluororesin powder. With regard to the inorganic powder, what has been suitably subjected to surface treatment can be used in order to heighten lipophilic nature on the particle surfaces thereof.

It is necessary for the formation of a pattern that the average particle diameter of the powder is 5 μm or less. When the average particle diameter of the powder is in excess of 5 μm, sharp lines of a pattern cannot be formed. The average particle diameter of 1 μm or less is more preferable for the formation of the fine pattern.

In the present invention, it is important that the amount of the powder (b) added is from 3 to 50 parts by weight, preferably from 3 to 30 parts by weight, based on 100 parts by weight of the resin (a). When the amount of the powder (b) added is less than 3 parts by weight, task-free and pencil hardness of the resulting coating cannot be sufficiently improved, and conversely when it is more than 50 parts by weight, the resulting coating is poor in smoothness.

As the inorganic or the organic powder used in the present invention, there can also be used a grafted powder on the surfaces of which an organic substance is grafted.

This grafted inorganic powder (b) can be prepared by grafting a silane compound or the like on functional groups such as OH groups present on the inorganic particles of the inorganic powder, as is disclosed in detail in, for example, U.S. Pat. No. 4,482,656. In general, saturated and unsaturated and substituted or unsubstituted hydrocarbon groups are grafted on inorganic atoms on the inorganic powder particles mainly in accordance with the following graft processes.

(1) A process for introducing alkyl groups on inorganic atoms, for example, silicon atoms in silica, which comprises chlorinating SiOH groups on an inorganic powder such as silica with thionyl chloride, and then alkylating the resultant chlorinated product with an alcohol.

(2) A process for introducing organic substituents on silicon atoms in silica or aluminum atoms in alumina, which comprises reacting SiOH groups on an inorganic powder, for example, silica or alumina with a chlorosilane having an organic substituent such as trichlorovinylsilane.

(3) A process for introducing silanol groups an inorganic atoms, for example, silicon atoms on silica or aluminum atoms on alumina, which comprises reacting SiOH groups on silica or alumina with a silane compound having a silanol group and an organic group.

The preferable inorganic powder to be grafted is silica or alumina having an average particle diameter of from 0.001 to 0.1 μm. When the inorganic powder having an average particle diameter of larger than 0.1 μm is used, the resulting coating will not have a smooth surface and its hardness will not increase undesirably. Preferable examples of silica are thermally decomposed or pyrolyzed silica or precipitated silica.

The saturated or unsaturated and substituted or unsubstituted hydrocarbon group which will be grafted on silicon atoms on silica or aluminum atoms on alumina directly or via oxygen atoms, silicon atoms or the like is an organic residue such as butyl, hexyl, heptyl, oleyl, decanyl, (meth-)acryloyalkyl, glycidoxyalkyl or 3,4-epoxycyclohexylalkyl. When this hydrocarbon group has an ethylchic double bond or an epoxy group, it can copolymerize with the above-mentioned modified resin (a) by photocuring.

The total of the carbon atoms of the hydrocarbon residue which has been grafted is preferably 4 or more per inorganic atom such as silicon. When the number of the carbon atoms is less than 4, the viscosity of said residue tends to increase, which makes handling difficult. In view of this fact, for example, a grafted silica which can be obtained by reacting with trimethylchlorosilane is not preferable.

It is preferred that at least 20% by weight of the organic substituent is grafted on the ungrafted inorganic powder. If the amount of the organic substituent is less than the above-mentioned limit, smooth coating surfaces cannot be obtained.

In the present invention, it is important that the amount of the grafted inorganic powder (b) is in the range of from 3 to 50 parts by weight, preferably from 3 to 30 parts by weight, based on 100 parts by weight of the above-mentioned modified resin (a). If the amount of the grafted inorganic powder (b) is less than 3 parts by weight, absence of tack and pencil hardness of the obtained coating cannot be sufficiently improved, and conversely if it is more than 50 parts by weight, the smoothness of the resulting coating is poor. Either of these cases is not preferable.

The grafted inorganic powder of the component (b) can be mixed with the modified resin of the component (a) directly or after dissolved or dispersed in a solvent.

The photopolymerization initiator (c) to be used in the present invention may be any conventional one and includes not only benzoin, benzoin methyl ether, benzoin methyl ether, benzoin isobutyl ether, benzil, Michler's ketone and 2,4-diethylthioxanthone but also compounds commercially available under the trade name of Irgacures 184, 651 and 907 (products of Cib-Geigy) and Darocure 1173 (a product of Merck & Co.), which may be used singly or jointly. The photopolymerization initiator is used in an amount of 0.1 to 20 parts by weight per 100 parts by weight of the modified resin (a). If the amount is less than 0.1 part by weight, the photocurability of the resulting composition will be unfavorably low, while if it exceeds 20 parts by weight, the strength of the resulting photosensitive coating will be lowered unfavorably.

An arbitrary fourth component may be added to the composition of the present invention in such a range as not to make the coating tacky. The fourth component includes photopolymerizable monomers such as triacrylate or aminoacrylate; epoxyacrylate resin; wax; and special imide compounds.

The photocurable resin composition of the present invention comprising the modified resin (a) and the photopolymerization initiator (b) may be coated with a roll coater or an applicator in the form of a so-called varnish prepared by dissolving it in a suitable solvent or may be electrodeposited in the form of an aqueous solution or dispersion.

When the composition is applied by electrodeposition, it is suitable to neutralize at least 10% of the carboxyl groups present in the modified resin (a) with a conventional base to thereby make the resin soluble or dispersible in water. When the extent of neutralization is too low, the resulting composition will be poor in water solubility or dispersibility, thus being unfit for water-based coating material. The base to be used in the neutralization includes ammonia; amines such as diethylamine, triethylamine, monoethanolamine, diethanolamine, N,N-dimethylethanolamine and N,N-dimethylbenzylamine; and potassium hydroxide. If necessary, various organic solvents may be added to the composition for the purpose of improving the water solubility or dispersibility of the composition or controlling the flowability of the coating. Examples of such organic solvents include water-soluble ones such as ethyl Cellosolve, butyl Cellosolve, ethylene glycol dimethyl ether, diacetone alcohol, 4-methoxy-4-methylpentanone-2 and methyl ethyl ketone; and nonaqueous ones such as xylene, toluene, methyl isobutyl ketone and 2-ethylhexanol.

The composition for electrodeposition coating, prepared by the neutralization described above, is a water-based one and is therefore apparently advantageous in respect of safeness and production.

The photocurable resin composition of the present invention may suitably contain a conventional heat polymerization stabilizer such as hydroquinone, 2,6-di-t-butyl-p-cresol, p-benzoquinone, hydroquinone monomethyl ether, phenothiazine or α-naphthylamine.

Although the photocurable resin composition of the present invention can be applied to an arbitrary substrate, the case of applying it to copper-clad laminate will be described as an example.

The application of the composition according to the present invention to a copper-clad laminate may be conducted either by a conventional dip, roll or curtain coating method or by converting the composition into a water-based coating material according to a conventional process and electrodepositing the water-based coating material. The drying is conducted generally at 120° C. or below, preferably at 100° C. or below, for 5 to 20 minutes. When the drying temperature exceeds 120° C., the coating will be heat-cured unfavorably.

The coating thus formed is a tack-free one having a smooth surface which is very useful as a photosensitive coating for the formation of a circuit pattern.

The photosensitive coating formed on a copper-clad laminate is exposed to an actinic radiation such as ultraviolet rays through a negative mask to cure exposed portions of the coating.

Although the actinic radiation to be favorably used in the curing of the coating varies depending upon the absorption wavelength of the photopolymerization initiator, it is generally ultraviolet rays emitted from xenon lamps, metal halide lamps, low-, medium-, high- or ultra-high-pressure mercury vapor lamps, or electron beams or α-, β- or γ-rays emitted from an electron accelerator. The luminous intensity of a light source and the irradiation time may be suitably selected. Further, the irradiation may be conducted either in the open air or in an inert atmosphere such as nitrogen.

After the irradiation, the coating-covered substrate is subjected to development with a suitable developer by which unexposed portions of the coating are dissolved, thereby to bring the conductive film in a circuit pattern. The conductive film is removed with an etching agent, followed by the removal of the cured coating with a suitable release agent. Thus, a wiring pattern of extremely high resolution can be obtained. After the development, the remaining coating may be post-cured by the irradiation with UV rays or at a temperature of 120° C. or above to thereby improve the resistance of the coating to etching.

According to the present invention, a photosensitive coating which is substantially tack-free even when used in practical light exposure equipment and has a sufficiently high hardness can be obtained. Thus, the photocurable composition of the present invention is suitable for the preparation of a printed wiring board of a photosensitive type.

Furthermore, the composition of the present invention can inhibit the coating from excessively flowing in the drying step after application, and therefore this composition has the effect of preventing edge portions around through-holes from being damaged, while if a photosensitive coating flows in the drying step to decrease the coating thickness of the edge portions then the resulting thinned coating at the edge portions will not sufficiently protect said portions at the time of etching.

PREFERRED EXAMPLES OF THE INVENTION

The present invention will now be described in more detail by referring to the following Examples and so on, though the present invention is not limited to them.

Resin Preparation 1

322 g of a liquid butadiene polymer prepared by polymerizing butadiene at 30° c in the presence of benzyl sodium as a catalyst and toluene as a chain transfer agent and having a number average molecular weight of 1,000, a viscosity of 14 poise at 25° C. and a 1,2-bond content of 65%, 245 g of maleic anhydride, 10 g of xylene and 1.1 g of Antigen 6C (a product of Sumitomo Chemical Co., Ltd., trade name) were fed into a 1-l separable flask fitted with a reflux condenser and a nitrogen gas inlet tube and reacted together at 190° C. in a stream of nitrogen for 4.5 hours. The unreacted maleic anhydride and the xylene were distilled off to obtain a maleinized butadiene polymer having a total acid number of 480 mgKOH/g. The polymer had a softening point of 128° C. (as determined by the ring and ball softening point according to JIS K 2531 -60).

200 g of the above maleinized butadiene polymer, 180 g of triethylene glycol dimethyl ether and 0.2 g of hydroquinone were introduced into a 1-l separable flask fitted with a reflux condenser and a nitrogen/air inlet tube. The flask so charged was immersed in an oil bath at 150° C. and the contents were mildly stirred to dissolve the polymer completely.

117.6 g of 2-hydroxypropyl acrylate and 16 g of triethylamine were added to the reaction mixture while blowing air into the obtained mixture little by little through the inlet tube, and the mixture was stirred at 70° C. for 6 hours to give a modified resin A.

The nonvolatile content of the modified resin A was 57% and the acid value thereof was 178 mgKOH/g of resin.

Preparation 2

50 Kg of purified water was fed into a bath having an inner volume of 100 l and fitted with a stirrer, incorporated with acetic acid to adjust its pH value to 3.5 and further incorporated with 1.25 Kg of a silane coupling agent A174 (a product of Nippon Unicar Co., Ltd., γ-methacryoxypropyltrimethoxysilane), after which the whole was stirred at room temperature for one hour to hydrolyze sufficiently the methoxy group of the silane coupling agent A174 and then incorporated with 5 Kg of Aerosil 380 (a product of Nippon Aerosil Co., Ltd.) which is highly pure and ultrafine silica little by little over a period of time of 40 to 60 minutes. Then, the thus obtained mixture was quickly put in a spray dryer (NIRO ATOMIZER 092-0929-00) operating under the conditions of an evacuation degree of 150 to 100 mmHg, a system temperature of 250° C. and a rotor revolution rate of 20000 rpm, to dehydrate and dry thereby to obtain a grafted silica.

EXAMPLE 1

Aerosil 380 (trade name: thermally decomposed silica, average particle diameter: 0.007 μm) was added to the modified resin A prepared in the Resin Preparation 1 in an amount of 15 parts by weight per 100 parts by weight of the solid content of the resin, and the resulting mixture was incorporated with Irgacure 907 (a product of Ciba-Geigy) as a photopolymerization initiator and 2,4-diethylthioxanthone in amounts of 7.2 and 0.8% by weight based on the solid resin content, respectively, further with triethylamine in such an amount as to neutralize one-third of the acid groups present in the resin and stirred at 40° C. for one hour, after which purified water was added portionwise to the obtained mixture in such an amount that the solid content of said obtained mixture was 15% by weight to disperse the mixture in water with aid of glass beads as a mixing assistant according to a conventional process to prepare a photocurable composition for electrodeposition coating. This composition had a pH of 6.7 and an electrical conductivity of 1.50 mS/cm.

This composition was electrodeposited on a copper-clad laminate which had preliminarily been brushed, cleaned and degreased under the conditions which will be described below, drained and dried at 80° C. for 20 minutes to give a coating having a thickness of 15 μm.

The coating was subjected to the tack test, photosensitivity test and pencil hardness test which will be described below. The results are given in Table 1.
(electrodeposition conditions)

electrodeposition method: anionic deposition, constant current method: 90 to 110 mA/dm² for 3 min.

EXAMPLE 2

Aluminum silicate (trade name of ASP-600, a product of Tsuchiya Kaolin Industrial Co., Ltd., average particle diameter of 0.6 μm) was added to the modified resin A prepared in Resin Preparation 1 in an amount of 10 parts by weight per 100 parts by weight of the solid resin content, Irgacure 907 (a product of Ciba-Geigy) as a photopolymerization initiator and 2,4-diethylthioxanthone were further added to the resulting mixture in amounts of 7.2 and 0.8% by weight based on the solid resin content, respectively. The thus obtained mixture was stirred at 40° C. for one hour while being shielded from the light to prepare a photocurable resin composition.

This composition was applied to a copper-clad laminate which had preliminarily been brushed, cleaned and degreased with an applicator and dried at 80° C. for 20 minutes to give a coating having a thickness of 15 μm.

This coating thus obtained was subjected to the tack test, photosensitivity test and pencil hardness test which will be described below. The results are given in Table 1.

EXAMPLE 3

Fluororesin powder (average particle diameter of 2.0 μm) was added to the modified resin A prepared in Resin Preparation 1 in an amount of 3 parts by weight per 100 parts by weight of the solid resin content and Irgacure 907 (a product of Ciba-Geigy) as a photopolymerization initiator and 2,4- diethylthioxanthone were further added to the resulting mixture in amounts of 7.2 and 0.8% by weight based on the solid resin content, respectively. The thus obtained mixture was stirred at 40° C. for one hour while being shielded from the light to prepare a photocurable resin composition.

This composition was applied to a copper-clad laminate which had preliminarily been brushed, cleaned and degreased with an applicator and dried at 80° C. for 20 minutes to give a coating having a thickness of 15 μm.

The coating was subjected to the tack test, photosensitivity test and pencil hardness test which will be described below. The results are given in Table 1.

EXAMPLE 4

Grafted silica prepared in Preparation 2 was added to the modified resin A prepared in Resin Preparation 1 in an amount of 20 parts by weight per 100 parts by weight of the solid resin content and Irgacure 907 (a product of Ciba-Geigy) as a photopolymerization initiator and 2,4-diethyl-thioxanthone were further added to the resulting mixture in amounts of 7.2 and 0.8% by weight based on the solid resin content, respectively. Triethylamine was added to the thus obtained mixture in such an amount as to neutralize one-third of the acid groups present in the resin to obtain a further mixture which was stirred at 40° C. for one hour. Deionized water was portionwise added to the further mixture in an amount of 15% by weight based on the solid content to disperse the mixture in water with aid of glass beads as a mixing assistant according to a conventional process to prepare a photocurable composition for electrodeposition coating. This composition had a pH of 6.6 and an electrical conductivity of 1.50 mS/cm.

This composition was electrodeposited on a copper-clad laminate which had preliminarily been brushed, cleaned and degreased under the same conditions as those employed in Example 1, drained and dried at 100° C. for 5 minutes to give a coating having a thickness of 15 μm.

This coating was subjected to the tack test, photosensitivity test and pencil hardness test which will be described below. The results are given in Table 1.

EXAMPLES 5 AND 6

Grafted silica prepared in Preparation 2 was added to the modified resin A prepared in Resin Preparation 1 in an amount of 20 parts by weight in Example 5 and 40 parts by weight in Example 6 per 100 parts by weight of the solid resin content. Irgacure 907 (a product of Ciba-Geigy) as a photopolymerization initiator and 2,4 -diethyl-thioxanthone were added to the resulting mixture in amounts of 7.2 and 0.8% by weight based on the solid resin content, respectively, in each of Example 5 and and 6. In each of these Examples, the obtained mixture was stirred at 40° C. for one hour while being shielded from the light to prepare a photocurable resin composition.

Each of these compositions was applied to a copper-clad laminate which had preliminarily been brushed, cleaned and degreased with an applicator and dried at 80° C. for 20 minutes to give a coating having a thickness of 15 μm.

The coatings thus obtained were subjected to a tack test, photosensitivity test and pencil hardness test which will be described below. The results are given in Table 1.

Comparative Example 1

Benzoinisobutylether as a photopolymerization initiator was added to the resin A prepared in Resin Preparation 1 in an amount of 8% by weight based on the total solid content and the whole was stirred at a temperature of not higher than 40° C. for one hour to prepare a photocurable resin composition.

The composition was applied to a copper-clad laminate which had preliminarily been brushed, cleaned and degreased with an applicator and dried at 80° C. for 20 minutes to give a coating having a thickness of 15 μm.

The coating was subjected to the tack test, photosensitivity test and pencil hardness test which will be described below. The results are given in Table 1.

Comparative Example 2

Irgacure 907 (a product of Ciba-Geigy) as a photopolymerization initiator was added to the modified resin A prepared in Resin Preparation 1 in an amount of 8.0% by weight based on the solid resin content. Triethylamine was added to the obtained mixture in such an amount as to neutralize one-third of the acid groups present in the resin. The resulting mixture was dispersed in water according to a conventional process to give a photocurable composition for electrodeposition coating. This composition had a nonvolatile content of 15%, a pH of 6.6 and an electrical conductivity of 1.80 mS/cm.

The composition was electrodeposited on a copper-clad laminate which had preliminarily been brushed, cleaned and degreased under the same conditions as those employed in Example 1, drained and dried at 100° C. for 5 minutes to give a coating having a thickness of 15 μm.

This coating was subjected to the tack test, photosensitivity test and pencil hardness test which will be described below. The results are given in Table 1.

TABLE 1

|  | Ex. 1 | Ex. 2 | Ex. 3 | Ex. 4 | Ex. 5 | Ex. 6 | Copm. Ex. 1 | Comp. Ex. 2 |
|---|---|---|---|---|---|---|---|---|
| Composition % by weight |  |  |  |  |  |  |  |  |
| resin A | 100 | 100 | 100 | 100 | 100 | 100 | 100 | 100 |
| material (b) | 15 | 10 | 3 | 20 | 10 | 40 | none | none |
|  | thermally decomposed | aluminum silicate | fluoresin powder | grafted silica | grafted silica | grafted silica |  |  |
| Application method | electro-deposition | applicator | applicator | electro-deposition | applicator | applicator | applicator | applicator |
| Evaluation |  |  |  |  |  |  |  |  |
| tack | O | O | O | O | O | O | X | X |

TABLE 1-continued

|  | Ex. 1 | Ex. 2 | Ex. 3 | Ex. 4 | Ex. 5 | Ex. 6 | Copm. Ex. 1 | Comp. Ex. 2 |
| --- | --- | --- | --- | --- | --- | --- | --- | --- |
| pensil hardness | 2B | 2B | 3B | 2B | 2B | 2B | 4B | 4B |
| photo-sensitivity | ○ | ○ | ○ | ○ | ○ | ○ | ○ | ○ |

(tack test)

A copper clad laminate having a photosensitive coating formed thereon was put in a dark thermo-hydrostat at 30° C. A negative mask (made of PET film) having a circuit pattern drawn thereon was put on the coating. A glass plate having a thickness of 1.5 mm and a weight were put on the mask to thereby apply a pressure of 0.2 kg/cm² (corresponding to a pressure applied in vacuum adhesion) to the interface between the mask and the coating. The resulting system was kept as such for 5 minutes, followed by the removal of the glass plate and the weight. Then, the mask was peeled off to evaluate the peel properties according to the following criteria. In this test, the test apparatus to be used was heated to the temperature of the testing atmosphere prior to the use.

○: the mask was peeled off without making any peel noise and meeting with any resistance.

×: the peeling of the mask met with a resistance and made a distinct peel noise.

(photosensitivity test)

A pattern line was formed with a circuit pattern mask for evaluation having line width of 50 and 100 μm under the following exposure and development conditions to evaluate the pattern reproductivity microscopically.

○: a pattern was formed

×: no pattern was formed (1) exposure conditions apparatus: UVC-2613 mfd. by Ushio Electric Inc.

light source: metal halide lamp quantity of light: 170 mJ/cm²

(2) development conditions apparatus: homemade spray equipment (spray pressure: 1.35 kg/cm²)

developer: 1% aqueous sodium carbonate solution temperature of the developing solution: 30° C.

We claim:

1. A photocurable resin composition consisting essentially of (A) 100 parts by weight of a modified resin prepared by reacting (a) an adduct having a softening point ranging from 70° to 200° C. obtained by reacting an α,β-unsaturated dicarboxylic acid anhydride with a conjugated diene polymer or copolymer having a number average molecular weight of 500 to 5000 and a vinyl group content of at least 50 mole %, with (b) an α,β-unsaturated monocarboxylic acid ester having an alcoholic hydroxyl group of formula (I), $$HC=C-C-O-R_3-OH \quad (I)$$
$$\phantom{HC=}|\phantom{=}|\phantom{-C-}||$$
$$\phantom{HC=}R_1\phantom{=}R_2\phantom{-}O$$

wherein said α,β-unsaturated monocarboxylic acid ester is a member selected from the group consisting of 2-hydroxyethyl acrylate, 2-hydroxyethyl methacrylate, 2-hydroxypropyl acrylate, 2-hydroxypropyl methacrylate, N-methylolacrylamide, 2-hydroxy-3-phenoxypropyl acrylate and 2-hydroxy-3-phenoxypropyl methacrylate whereby at least 10 mole % of the ring of the acid anhydride in said adduct is opened;

(B) 3 to 50 parts by weight of an inorganic or organic powder having an average particle diameter not larger than 5 μm, and (C) 0.1 to 20 parts by weight of a photopolymerization initiator.

2. The photocurable resin composition according to claim 1, wherein said α,β-unsaturated dicarboxylic acid anhydride is maleic acid anhydride.

3. The photocurable resin composition according to claim 1, wherein said conjugated diene is butadiene.

4. The photocurable resin composition according to claim 1, wherein said average particle diameter of inorganic or organic powder in said component (b) is not larger than 1 μm.

5. The photocurable resin composition according to claim 1, wherein said inorganic powder in said component (b) is a member selected from the group consisting of thermally decomposed silica, precipitated silica, alumina, alumino silicate and phthalocyanine blue.

6. A photocurable resin composition consisting essentially of (A) 100 parts by weight of a modified resin prepared by reacting (a) an adduct having a softening point ranging from 70° to 200° C. obtained by reacting an α,β-unsaturated dicarboxylic acid anhydride with a conjugated diene polymer or copolymer having a number average molecular weight of 500 to 5000 and a vinyl group content of at least 50 mole %, with (b) an α,β-unsaturated monocarboxylic acid ester having an alcoholic hydroxy group of formula (I), $$HC=C-C-O-R_3-OH \quad (I)$$
$$\phantom{HC=}|\phantom{=}|\phantom{-C-}||$$
$$\phantom{HC=}R_1\phantom{=}R_2\phantom{-}O$$

wherein said α,β-unsaturated monocarboxylic acid ester is a member selected from the group consisting of 2-hydroxyethyl acrylate, 2-hydroxyethyl methacrylate, 2-hydroxypropyl acrylate, 2-hydroxypropyl methacrylate, N-methylolacrylamide, 2-hydroxy-3-phenoxypropyl acrylate and 2-hydroxy-3-phenoxypropyl methacrylate whereby at least 10 mole % of the ring of the acid anhydride in said adduct is opened;

(B) 3 to 50 parts by weight of a grafted inorganic powder prepared by grafting an inorganic powder having functional groups with a reactant to provide a hydrocarbon residue thereon, said hydrocarbon residue being a saturated or unsaturated member selected from the group consisting of n-hexyl, n-octyl, 3-butenyl, oleyl, acryloxyalkyl and methacryloxyalkyl in which the alkyl group has 2 to 6 carbon atoms, glycidoxyalkyl, epoxycyclohexylethyl and isobutyl, the total number of carbon atoms in said hydrocarbon residue per inorganic atom being not less than 4, said grafted inorganic powder having an average particle diameter not larger than 0.1 μm and (C) 0.1 to 20 parts by weight of a photopolymerization initiator.

7. The photocurable resin composition according to claim 6, wherein said α,β-unsaturated dicarboxylic acid anhydride is maleic acid anhydride.

8. The photocurable resin composition according to claim 6, wherein said conjugated diene is butadiene.

9. The photocurable resin composition according to claim 6, wherein said average particle diameter of said inorganic powder in said component (b) is not larger than 1 μm.

10. The photocurable resin composition according to claim 6, wherein said grafted inorganic powder in said component (b) is obtained by hydrolyzing trialkoxysilane into an aqueous acid solution, dispersing the hydrolyzed trialkoxysilane in a finely divided inorganic powder having an average particle diameter not larger than 0.1 μm to form a dispersion, dehydrating the thus obtained dispersion by heating to a temperature ranging from 80° to 110° C. whereby the hydrolyzed trialkoxysilane is chemically absorbed on the particles of said inorganic powder in an amount of at least 20% by weight of the total particles of the inorganic powder.

11. A photocurable resin composition according to claim 6, wherein said inorganic powder in said component (b) is a member selected from the group consisting of thermally decomposed silica, precipitated silica, alumina, alumino silicate and phthalocyanine blue.

12. A photocurable resin composition according to claim 11, wherein said inorganic powder is a member selected from the group consisting of thermally decomposed silica and precipitated silica and alumina.

* * * * *